(12) United States Patent
Muraoka et al.

(10) Patent No.: US 7,692,445 B2
(45) Date of Patent: Apr. 6, 2010

(54) OUTPUT BUFFER CIRCUIT AND DIFFERENTIAL OUTPUT BUFFER CIRCUIT, AND TRANSMISSION METHOD

(75) Inventors: Satoshi Muraoka, Yokohama (JP); Norio Chujo, Tokyo (JP); Ritsuro Orihashi, Tokyo (JP)

(73) Assignee: Hitachi, Ltd. (JP)

( * ) Notice: Subject to any disclaimer, the term of this patent is extended or adjusted under 35 U.S.C. 154(b) by 340 days.

(21) Appl. No.: 11/686,560

(22) Filed: Mar. 15, 2007

(65) Prior Publication Data

US 2008/0265944 A1 Oct. 30, 2008

(30) Foreign Application Priority Data

Mar. 15, 2006 (JP) ............... 2006-070415

(51) Int. Cl.
*H03K 19/003* (2006.01)
(52) U.S. Cl. ............... 326/27; 326/86; 326/87
(58) Field of Classification Search ............... 326/26, 326/27, 82, 83, 86, 87; 327/108, 109
See application file for complete search history.

(56) References Cited

U.S. PATENT DOCUMENTS

2002/0030517 A1* 3/2002 Kurisu et al. ............... 327/108
2003/0193351 A1* 10/2003 Fukui ............... 326/83
2006/0071687 A1* 4/2006 Kim ............... 326/82
2007/0050572 A1* 3/2007 Tanaka ............... 711/154

FOREIGN PATENT DOCUMENTS

| JP | 2001-326417 | 11/2001 |
|---|---|---|
| JP | 2001-352238 | 12/2001 |
| JP | 2002-208969 | 7/2002 |
| JP | 2002-223161 | 8/2002 |
| JP | 2006-109093 | 4/2006 |

* cited by examiner

*Primary Examiner*—Vibol Tan
*Assistant Examiner*—Jany Tran
(74) *Attorney, Agent, or Firm*—Antonelli, Terry, Stout & Kraus, LLP.

(57) ABSTRACT

In an output buffer circuit including Inverter 1 to Inverter 3, Delay Circuit 1 to Delay Circuit 3 for delaying an input signal for a specific time, Buffer 1 to Buffer 3, and a function for transmitting a logic signal to a transmission path and in accordance with an amount of signal attenuation in the transmission path, creating at a transmission side a waveform including four or more kinds of signal voltages, the preemphasis amount is made variable and the ON resistance Rs of the buffer is made constant. Selector circuit 1 to Selector circuit 3 are situated before the buffers, the inverter, capable of selecting through selector logic a signal to be inputted to the buffer, inverts a data signal, and the preemphasis amount and the number of preemphasis taps are adjusted through a selection signal for the selector logic.

9 Claims, 8 Drawing Sheets

OUTPUT BUFFER CIRCUIT AND DIFFERENTIAL OUTPUT BUFFER CIRCUIT, AND TRANSMISSION METHOD

The present application is based on and claims priority of Japanese patent application No. 2006-070415 filed on Mar. 15, 2006, the entire contents of which are hereby incorporated by reference.

BACKGROUND OF THE INVENTION

The present invention relates to an output buffer circuit for transmitting a logic signal to a transmission line, and more particularly to an output buffer circuit that has a function of applying preemphasis to a transmission-output waveform so as to compensate signal attenuation in a transmission line.

The operating speeds of electronic circuit devices have been raised year after year, and research and development for realizing a higher-speed electronic circuit device have actively been performed. The realization of speedup of an electronic circuit device provides convenience in which, for example, processing that conventionally takes an extremely long time can be dealt with in a short time, or processing that has been thought to be impossible becomes possible. The speedup of an electronic circuit device reduces processing costs and contributes to enhancement of services in the world. In addition, the industry is further revitalized so as to manufacture the foregoing superior devices.

Because of realization of speedup of an electronic circuit device, the request for raising the speed of data-signal transmission, e.g., between LSI internal circuits that are constituent elements of an electronic circuit device, between LSIs, between printed wire boards, and between apparatus cases, has been enhanced.

As one of the techniques for raising the speed of data transmission, e.g., a technique, as disclosed in Japanese Patent Laid-Open Publication No. 2003-30946 (Patent Document 1), is known in which a termination resistor that matches the characteristic impedance of a transmission line is arranged at a signal reception unit so as to prevent the reflection of a received signal, thereby preventing data from being transmogrified by a reflected wave.

Moreover, in order to compensate the signal attenuation in a transmission line exemplified by an LSI inner wiring conductive strip, an LSI package wire, a printed-wire-board conductive strip, a cable, a connecter, and the like, an output buffer circuit, which has a preemphasis function for enhancing the signal amplitudes of high-frequency components in a signal or reducing the signal amplitudes of low-frequency components, has been put to practical use.

FIG. 7 is a configuration example of a conventional output buffer circuit disclosed in Patent Document 1. The foregoing output buffer circuit has an inverter 1, a delay circuit, a buffer, and a tri-state buffer, receives a data signal as an input, and outputs a transmission signal from an output terminal to a transmission line. The transmission line is connected at a reception terminal to a termination voltage Vt via a termination resistor Rt; the termination resistor Rt is made equal to the characteristic impedance of the transmission line so that no reflection wave is caused due to an impedance mismatch.

The inverter 1 receives a data signal and outputs an inverted signal. The delay circuit receives a data signal and outputs a delayed signal that is delayed by the duration corresponding to one cycle of the data. The buffer receives the inverted signal and outputs at the output terminal a transmission signal.

In the buffer, a P-type transistor 101 and an N-type transistor 102 operate complementarily to each other; the P-type transistor 101 and the N-type transistor 102 each have the same ON resistance Ra. The tri-state buffer receives the inverted signal and the delayed signal of a data signal and outputs at the output terminal a transmission signal. In the tri-state buffer, a P-type transistor 103 and an N-type transistor 106 each receive as an input the delayed signal of a data signal and operate complementarily to each other; the P-type transistor 104 and the N-type transistor 105 each receive as an input the inverted signal of the data signal and operate complementarily to each other. Accordingly, the configuration is in such a way that, in the case where an inverted signal and a delayed signal each have the same logical value, the tri-state buffer outputs an inverted logical value, and in the case where the inverted signal and the delayed signal do not have the same logical value, the tri-state buffer becomes OFF-state and does not drive the output terminal. The combined series on resistance of the P-type transistor 103 and the P-type transistor 104 and the combined series resistance of the N-type transistor 105 and the N-type transistor 106 each have the same ON resistance Rb.

FIG. 8 is a time chart for explaining the operation of a conventional output buffer circuit disclosed in Patent Document 1. At the time instant T1, a data signal transits from a low level to a high level; the inverted signal transits to the low level; the delayed signal remains at the low level. The P-type transistor 101 of the buffer and the P-type transistors 103 and 104 of the tri-state buffer each turn ON and the other transistors remain OFF-state. On this occasion, the output voltage of a transmission signal is Voh1. At the time instants T7 and T9, the situation is the same as that described above.

At the time instant T2, the data signal remains at the high level; the inverted signal remains at the low level; the delayed signal transits from the low level to the high level. The P-type transistor 101 of the buffer and the P-type transistor 104 and the N-type transistor 106 of the tri-state buffer each turn ON and the other transistors remain OFF-state. The tri-state buffer turns OFF, and the output voltage of the transmission signal is Voh2. At the time instants T3 and T10, the situation is the same as that described above.

At the time instant T4, the data signal transits from the high level to the low level; the inverted signal transits from the low level to the high level the delayed signal remains at the high level. The N-type transistor 102 of the buffer and the N-type transistors 105 and 106 of the tri-state buffer each turn ON and the other transistors remain OFF-state. On this occasion, the output voltage of the transmission signal is Vol1. At the time instants T8 and T11, the situation is the same as that described above.

At the time instant T5, the data signal remains at the low level; the inverted signal remains at the high level; the delayed signal transits from the high level to the low level. The N-type transistor 102 of the buffer and the N-type transistor 103 and the P-type transistor 104 of the tri-state buffer each turn ON and the other transistors remain OFF-state. The tri-state buffer turns OFF, and the output voltage of the transmission signal is Vol2. At the time instants T6 and T12, the situation is the same as that described above.

As described above, in the example of a conventional output buffer circuit, the output voltage of the transmission signal at the output terminal becomes Voh1 or Vol1 only for each one cycle during which the data signal changes, and becomes Voh2 or Vol2 at the other time instances; therefore, a preemphasis function is realized which enhances the signal amplitudes of high-frequency components in a signal or reduces the signal amplitudes of low-frequency components so as to compensate the signal attenuation in a transmission line.

SUMMARY OF THE INVENTION

In the foregoing conventional technique, as represented by the timing chart in FIG. 8, in the case where the output voltage of the transmission signal is Voh1 or Vol1, i.e., the tri-state buffer is turned ON, the output impedance of the output buffer circuit becomes a low resistance (Ra//Rb), i.e., the combined parallel resistance value of the ON resistance Ra of the buffer and the ON resistance Rb of the tri-state buffer. In contrast, in the case where the output voltage of the transmission signal is Voh2 or Vol2, i.e., the tri-state buffer is turned OFF, the output impedance of the output buffer circuit becomes a high resistance Ra.

Accordingly, the time instant when the output impedance of the output buffer circuit and the characteristic impedance of the transmission line do not coincide with each other is inevitably caused. It has been a problem that, due to the mismatching between the output impedance of the output buffer circuit and the characteristic impedance of the transmission line, the recurrent reflection of a reflected wave, which is produced at a position where mismatching of the characteristic impedance of a through-hole, a connector, or the like occurs, at the output terminal of the output buffer circuit is caused, thereby increasing jitters, whereby the operating speed is limited.

The present invention has been implemented in consideration of the foregoing circumstances; the output impedance of an output buffer circuit having an preemphasis function or a deemphasis function is made to be constant, regardless of an adjustable preemphasis amount, the number of preemphasis taps, and an operation time instant, and to match the characteristic impedance of a transmission line; thus, an output buffer circuit, in which no recurrent reflection is caused at the output terminal thereof and which enables high-speed operation, is provided.

In order to solve the foregoing problem, the present invention provides an output buffer circuit including one or more inverters, a delay circuit for delaying an input signal for a specific time, one or more buffers, a function for transmitting a logic signal to a transmission path and in accordance with an amount of signal attenuation in the transmission path, creating at a transmission side a waveform including four or more kinds of signal voltages, and a means for making the preemphasis amount variable and the ON resistance of the buffer constant.

Moreover, the present invention provides an output buffer circuit in which a select or circuit is situated before a buffer, an inverter, capable of selecting through selector logic a signal to be inputted to the buffer, inverts a data signal, and the preemphasis amount and the number of preemphasis taps are adjusted through a selection signal for the selector logic, so that the preemphasis amount is made variable and the ON resistance of the buffer is made constant.

The present invention provides an output buffer circuit in which a selector is situated before a buffer; the buffer includes a P-type transistor and an N-type transistor that are connected between a high-potential power source and a low-potential power source and operate complementarily to each other, with the assistance of an input signal, the ON resistance of the buffer is constant regardless of the output voltage, and two or more of the buffers are connected in parallel with one another; the inverter receives any one of or both of a data signal representing the logic value of the output of the buffer and the inverted signal of the data signal, can select through selector logic a signal to be inputted to the buffer, and inverts the data signal; the respective ON resistances of the buffers are determined in such a way that the combined parallel resistance value of the ON resistances of two or more of the buffers coincides with the characteristic impedance of a transmission line connected to the output terminal of the output buffer circuit; the preemphasis amount and the number of preemphasis taps are adjusted through a selection signal for the selector logic; and the transmission line is terminated, at the reception terminal thereof, with a termination resistor connected to a termination voltage.

Moreover, the present invention provides an output buffer circuit in which switches are included, two or more buffers are redundantly connected in parallel with one another, the number of the buffers that concurrently turn ON is controlled by the respective switches provided in series with the output resistors of the buffers, and by selecting the buffers the switches for which are turned ON, the preemphasis amount and the number of preemphasis taps are adjusted through a selection signal for the selector logic, so that the preemphasis amount is made variable and the ON resistance of the buffer is made constant.

Still moreover, the present invention provides an output buffer circuit in which switches are included; two or more buffers are redundantly connected in parallel with one another; the number of buffers, among the buffers, that concurrently turn ON is limited so that a specific value determined by the combined parallel resistance value of the respective ON resistances of the buffers that concurrently turn ON is determined in such a way as to coincide with the characteristic impedance of a transmission line connected to the output terminal of the output buffer terminal and to satisfy a desired preemphasis amount and a desired number of preemphasis taps; the number of the buffers that concurrently turn ON is controlled by the respective switches provided in series with the output resistors of the buffers; by selecting the buffers the switches for which are turned ON, the preemphasis amount and the number of preemphasis taps are adjusted through a selection signal for the selector logic and the transmission line is terminated, at the reception terminal thereof, with a termination resistor connected to a termination voltage.

Moreover, the present invention provides an output buffer circuit, in which a selector circuit situated before a buffer and a switch are included, so that the preemphasis amount is made variable and the ON resistance of the buffer is made constant.

Still moreover, the present invention provides an output buffer circuit in which the output resistor included in the buffer is formed of a resistance element or a P-type transistor and an N-type transistor, which operate complementarily to each other, that are integrated in the buffer.

Moreover, the present invention provides an output buffer circuit in which the reception terminal of a transmission line is terminated in a Thevenin-type termination form in which the reception terminal is connected to a high-potential power source and a low-potential power source.

Moreover, the present invention provides an output buffer circuit, in which the ON resistances of part or all of the buffers are made to be variable and enabled to be controlled through respective voltages supplied from the outsides of the buffers.

Still moreover, the present invention provides an output buffer circuit in which a buffer, which controls the ON resistance thereof as a variable resistor, has a P-type transistor and an N-type transistor that are connected between a high-potential power source and a low-potential power source; the P-type transistor and the N-type transistor operate complementarily to each other, with the assistance of a signal applied to the input terminal thereof; transistors that serve as variable resistors are connected between the P-type transistor and the N-type transistor; and respective resistance-adjustment variable voltages are applied to the gate pins of the transistors as the variable resistors, and by adjusting the variable voltages, the ON resistance of the buffer is adjusted.

Moreover, the present invention provides an output buffer circuit in which the buffer, which controls the ON resistance thereof as a variable resistor, is provided with a rising-time acceleration transistor so as to reduce an effect, on rising time, of a parasitic capacitance produced by the variable-resistor transistor.

Still moreover, the present invention provides an output buffer circuit in which, in a buffer, which controls the ON resistance thereof as a variable resistor, a P-type transistor and an N-type transistor that are connected between a high-potential power source and a low-potential power source operate complementarily to each other, with the assistance of a signal applied to the input terminal thereof; transistors that serve as variable resistors are connected between the output for the P-type transistor and the N-type transistor and the output terminal of the buffer; and respective resistance-adjustment variable voltages are applied to the gate pins of the transistors, and by adjusting the variable voltages, the ON resistance of the buffer is adjusted.

Furthermore, the present invention provides a differential output buffer circuit provided with two systems of output buffer circuits that are each identical to one of the output buffer circuits described above.

Moreover, the present invention provides a transmission method utilizing an output buffer circuit including one or more inverters, a delay circuit for delaying an input signal for a specific time, one or more buffers, a function for transmitting a logic signal to a transmission path and in accordance with an amount of signal attenuation in the transmission path, creating at a transmission side a waveform including four or more kinds of signal voltages, and a selector circuit situated before the buffer; the transmission method includes the following steps:

inverting a data signal, the inverter being capable of selecting through selector logic a signal to be inputted to the buffer and inverts a data signal; and adjusting a preemphasis amount and the number of preemphasis taps through a selection signal for the selector logic, thereby making the preemphasis amount variable and the ON resistance of the buffer constant.

Still moreover, the present invention provides a transmission method utilizing an output buffer circuit including one or more inverters, a delay circuit for delaying an input signal for a specific time, one or more buffers, a function for transmitting a logic signal to a transmission path and in accordance with an amount of signal attenuation in the transmission path, creating at a transmission side a waveform including four or more kinds of signal voltages, and switches; the transmission method includes the following steps:

controlling the number of the buffers that concurrently turn ON, by respective switches provided in series with the output resistors of the buffers, two or more of the buffers being redundantly connected in parallel with one another; and adjusting a preemphasis amount and the number of preemphasis taps, by selecting the buffers the respective switches for which are turned ON, thereby making the preemphasis amount variable and the ON resistance of the buffer constant.

These and other objects, features and advantages of the invention will be apparent from the following more particular description of preferred embodiment of the invention, as illustrated in the accompanying drawings.

DETAILED DESCRIPTION OF THE PREFERRED EMBODIMENTS

The best mode for embodying the present invention will be explained.

Examples of the present invention will be explained with reference to the drawings. According to the examples of the present invention, the objective, in which the output impedance of an output buffer circuit having an preemphasis function is made constant regardless of an adjustable preemphasis amount, the number of preemphasis taps, and an operational time instant so as to match the characteristic impedance of a transmission line, is realized in such a way that an unallowable increase in jitter, due to delay-time extension caused by control logic at the front stage in a buffer, is avoided, and the setting of the preemphasis amount is not restricted.

Example 1

Figure 1:
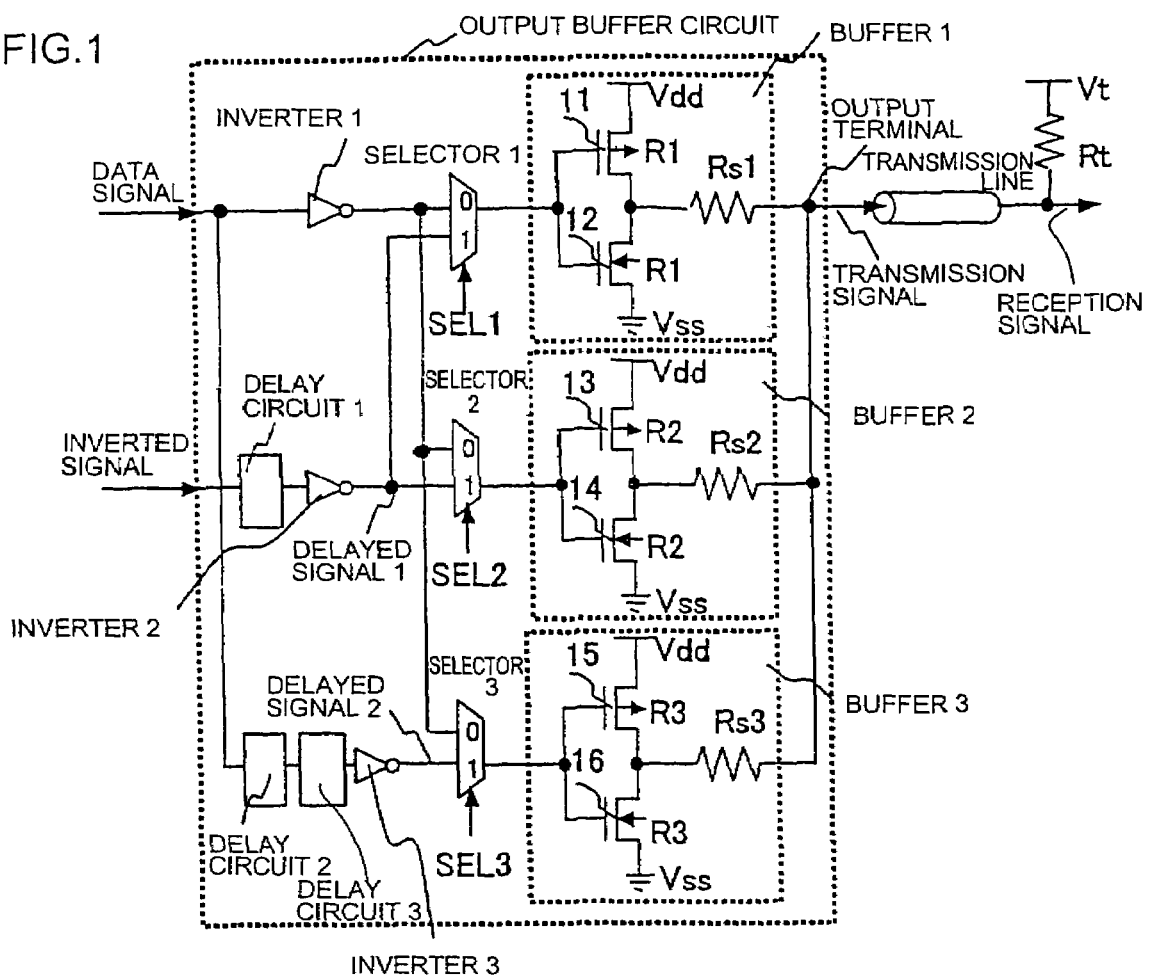
FIG. 1 is an explanatory diagram for a circuit configuration according to Example 1.

Example 1 will be explained. FIG. 1 is a configuration diagram illustrating circuitry according to Example 1 of the present invention. The output buffer according to Example 1 includes Buffer 1 to Buffer 3 that are connected in parallel with one another, selector logic for Selector 1 to Selector 3, Inverter 1 to Inverter 3, and Delay Circuit 1 to Delay Circuit 3. The output buffer receives a data signal and the inverted signal of the data signal and outputs a transmission signal to a transmission line connected to the output terminal.

The transmission line is connected at a reception terminal to a termination voltage Vt via a termination resistor Rt; the termination resistor Rt is made equal to the characteristic impedance of the transmission line so that no reflection wave is caused due to an impedance mismatch.

Inverter 1 receives a data signal having a logic value to be transmitted to the output terminal and outputs input signals for Selector 1 to Selector 3. Delay Circuit 1 receives an inverted signal having a logic value obtained by inverting a logic value to be transmitted to the output terminal and outputs Delayed Signal 1 via Inverter 2. Delayed Signal 1 is inputted to Selector 1 and Selector 2. Delay Circuit 2 receives a data signal and outputs Delayed Signal 2 via Delay Circuit 3 and Inverter 3. Delayed Signal 2 is inputted to Selector 3. Delay Circuit 1 to Delay Circuit 3 each outputs a signal obtained by delaying an input signal by a specific time represented by a time corresponding to one cycle of a data signal.

Buffer 1 receives the output signal of Selector 1 and outputs at the output terminal a transmission signal. Buffer 1, in which a P-type transistor 11 and an N-type transistor 12 are connected between a high-potential power source Vdd and a low-potential power source Vss operate complementarily to each other, drives the output terminal via an output resistor Rs1. The P-type transistor 11 and the N-type transistor 12 are each designed to have the same ON resistance R1; thus, the output impedance of Buffer 1 is given by the combined series resistance (R1+Rs1) of R1 and Rs1.

Buffer 2, connected between the high-potential power source Vdd and the low-potential power source Vss, receives the output signal of Selector 2 and outputs at the output terminal a transmission signal. Buffer 2, in which a P-type transistor 13 and an N-type transistor 14 operate complementarily to each other, drives the output terminal via an output resistor Rs2. The P-type transistor 13 and the N-type transistor 14 are each designed to have the same ON resistance R2; thus, the output impedance of Buffer 2 is given by the combined series resistance (R2+Rs2) of R2 and Rs2.

Buffer 3, connected between the high-potential power source Vdd and the low-potential power source Vss, receives the output signal of Selector 3 and outputs at the output terminal a transmission signal. Buffer 3, in which a P-type transistor 15 and an N-type transistor 16 operate complementarily to each other, drives the output terminal via an output resistor Rs3. The P-type transistor 15 and the N-type transistor 16 are each designed to have the same ON resistance R3; thus, the output impedance of Buffer 3 is given by the combined series resistance (R3+Rs3) of R3 and Rs3.

In Example 1, in each of Buffer 1 to Buffer 3, either one of the P-type transistor and the N-type transistor turns ON; therefore, the output impedance of the output buffer circuit, which is the combined parallel resistor Rs for Buffer 1 to Buffer 3, i.e., (R1+Rs1)//(R2+Rs2)/(R3+Rs3), is given by Equation 1.

$$Rs=(R1+Rs1)\times(R2+Rs2)\times(R3+Rs3)/((R1+Rs1)+(R2+Rs2)+(R3+Rs3)) \quad \text{Equation 1}$$

Selector-logic Selector 1 to Selector 3, which are situated before the buffers, are controlled through signals SEL 1 to SEL 3, respectively. The control signals, i.e., SEL 1 to SEL 3 are level signals generated by an external circuit that is not illustrated in FIG. 1. By changing the control signals SEL 1 to SEL 3, the respective input signals for Buffer 1 to Buffer 3 can be selected; thus, the preemphasis amount and the number of preemphasis taps can be selected. As far as the output impedance, represented by equation 1, of the output buffer circuit coincides with the characteristic impedance of the transmission line, the ON-resistance values of Buffer 1 to Buffer 3, i.e., (R1+Rs1), (R2+Rs2), and (R3+Rs3), respectively, can be designed so as to change the preemphasis amount; therefore, an output buffer circuit that can cope with various transmission-loss conditions is obtained.

Figure 2:
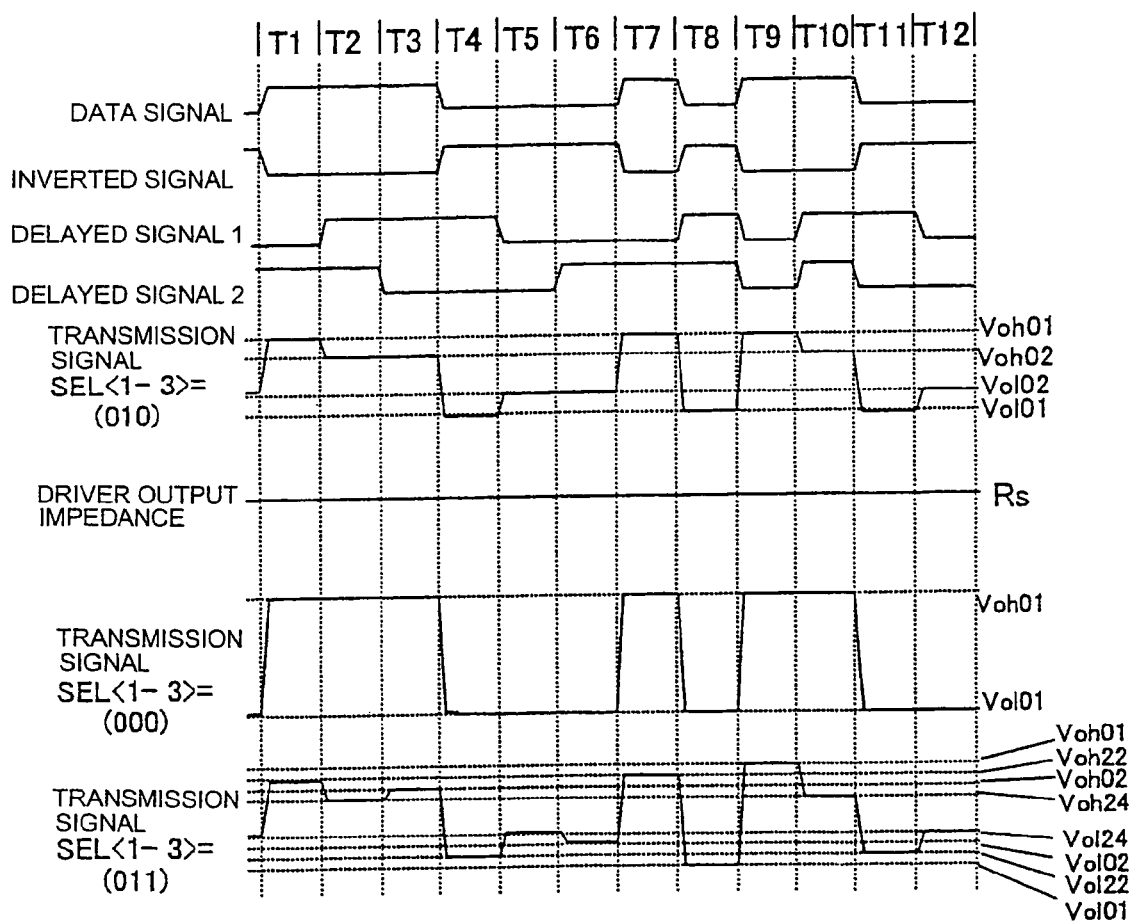
FIG. 2 is a timing chart representing the operation of Example 1.

FIG. 2 is a timing chart representing the operation of Example 1. The operation of the output buffer circuit according to Example 1 will be explained, while taking as a sample a case in which the selector control signals SEL 1="0", SEL 2="1", and SEL 3="0". In this case, the input signal of Buffer 1 is an inverted signal of a data signal; the input signal of Buffer 2 is Delayed Signal 1; the input signal of Buffer 3 is an inverted signal of the data signal.

At the time instant T1, the inverted signal transits from a high level to a low level; Delayed Signal 1 remains at the low level. The P-type transistor 11 of Buffer 1, the P-type transistors 13 of Buffer 2, and the P-type transistors 15 of Buffer 3 each turn ON and the other transistors remain OFF-state. On this occasion, the output voltage of the transmission signal is Voh01 that is given by Equation 2. At the time instants T7 and T9, the situation is the same as that described above.

$$Voh01=Vt+RT\times(Vdd-Vt)\times(1/(Rt+R1+Rs1)+1/(Rt+R2+Rs2)+1/(Rt+R3+Rs3)) \quad \text{Equation 2}$$

At the time instant T2, the inverted signal remains at the high level; Delayed Signal 1 transits from the low level to the high level. The P-type transistor 11 of Buffer 1, the N-type transistors 14 of Buffer 2, and the P-type transistors 15 of Buffer 3 each turn ON and the other transistors remain OFF-state. On this occasion, the output voltage of the transmission signal is Voh02 that is given by Equation 3. At the time instants T3 and T10, the situation is the same as that described above.

$$Voh02=Vt+RT\times(Vdd-Vt)\times(1/(Rt+R1+Rs1)+1/(Rt+R3+Rs3))-Rt\times(Vt-Vss)\times(1/(Rt+R2+Rs2)) \quad \text{Equation 3}$$

At the time instant T4, the inverted signal transits from the low level to the high level; Delayed Signal 1 remains at the high level. The X-type transistor 12 of Buffer 1, the N-type transistors 14 of Buffer 2, and the N-type transistors 16 of Buffer 3 each turn ON and the other transistors remain OFF-state. On this occasion, the output voltage of the transmission signal is Vol01 that is given by Equation 4. At the time instants T8 and T11, the situation is the same as that described above.

$$Vol01=Vt-Rt\times(Vt-Vss)\times(1/(Rt+R1+Rs1)+1/(Rt+R2+Rs2)+1/(Rt+R3+Rs3)) \quad \text{Equation 4}$$

At the time instant T5, the inverted signal remains at the high level; Delayed Signal 1 transits from the high level to the low level. The N-type transistor 12 of Buffer 1, the P-type transistors 13 of Buffer 2, and the N-type transistors 16 of Buffer 3 each turn ON and the other transistors remain OFF-state. On this occasion, the output voltage of the transmission signal is Vol02 that is given by Equation 5. At the time instants T6 and T12, the situation is the same as that described above.

$$Vol02=Vt-Rt\times(Vt-Vss)\times(1/(Rt+R1+Rs1)+1/(Rt+R3+Rs3))+Rt\times(Vdd-Vt)\times(1/(Rt+R2+Rs2)) \quad \text{Equation 5}$$

As described above, in an example of the output buffer circuit according to Example 1 of the present invention, the output voltage of the transmission signal at the output terminal becomes Voh1 or Vol1 only for each one cycle during which the data signal changes, and becomes Voh2 or Vol2 at the other time instances; therefore, a preemphasis function is realized which enhances the signal amplitudes of high-frequency components in a signal or reduces the signal amplitudes of low-frequency components so as to compensate the signal attenuation in a transmission line, whereby the output impedance of the output buffer circuit is constant regardless of the time instant.

Next, in the case where the selector control signals SEL 1 to SEL 3 are "0", all the input signals of Buffer 1 to Buffer 3 are the inverted signal of the data signal; thus, the output buffer circuit, which, as represented in FIG. 2, only outputs the same logic value as the data signal, stops the preemphasis function.

At the time instant T1, the inverted signal transits from the high level to the low level. The P-type transistor 11 of Buffer 1, the P-type transistors 13 of Buffer 2, and the P-type transistors 15 of Buffer 3 each turn ON and the other transistors remain OFF-state. On this occasion, the output voltage of the transmission signal is Voh01 that is given by Equation 2. At the time instants T2, T3, T7, T9, and T10, the situation is the same as that described above.

At the time instant T4, the inverted signal transits from the low level to the high level. The N-type transistor 12 of Buffer 1, the N-type transistors 14 of Buffer 2, and the N-type transistors 16 of Buffer 3 each turn ON and the other transistors remain OFF-state. On this occasion, the output voltage of the transmission signal is Vol01 that is given by Equation 4. At the time instants T8 and T6, T8, T11, and T12, the situation is the same as that described above. As described above, in an example of the output buffer Circuit according to Example 1 of the present invention, even a case, in which the preemphasis function is nullified so as to insert a short-distance and low-loss transmission line, can be dealt with.

Furthermore, the operation of the output buffer circuit according to Example 1 will be explained, while taking as a sample a case in which the selector control signals SEL 1="0", SEL 2="1", and SEL 3="1". In this case, the input signal of Buffer 1 is an inverted signal of a data signal; the input signal of Buffer 2 is Delayed Signal 1; the input signal of Buffer 3 is Delayed Signal 2. The Delayed Signal 2 is a data signal that is advanced by the delay time produced by Delay Circuit 2 and Delay Circuit 3; thus, the number of preemphasis taps can be increased. In other words, for example, preemphasis operation utilizing the data signal in the twice previous data cycle is enabled.

The output voltage of the transmission signal obtains an output waveform including eight output voltages that are given at the respective time instants, i.e., Voh22, Voh24, Vol22, and Vol24 given by the following equations Equation 6, Equation 7, Equation 8, and Equation 9, respectively, in addition to Voh01, Voh02, Vol01, and Vol02 given by Equation 2, Equation 3; Equation 4, Equation 5, respectively, so that an output buffer circuit more suitable for high-speed operation is obtained. Also in this case, the output impedance Rs of the output buffer circuit is constant.

$$Voh22 = Vt + Rt \times (Vdd - Vt) \times (1/(Rt+R1+Rs1) + 1/(Rt+R2+Rs2)) - Rt \times (Vt-Vss) \times (1/(Rt+R3+Rs3)) \quad \text{Equation 6}$$

$$Voh24 = Vt + Rt \times (Vdd-Vt) \times (1/(Rt+R1+Rs1) - Rt \times (Vt-Vss) \times (1/(Rt+R2+Rs2) + 1/(Rt+R3+Rs3)) \quad \text{Equation 7}$$

$$Vol22 = Vt - Rt \times (Vt-Vss) \times (1/(Rt+R1+Rs1) + 1/(Rt+R2+Rs2)) + Rt \times (Vdd-Vt) \times (1/(Rt+R3+Rs3)) \quad \text{Equation 8}$$

$$Vol24 \leq Vt - Rt \times (Vt-Vss) \times (1/(Rt+R1+Rs1)) + Rt \times (Vdd-Vt) \times (1/(Rt+R2+Rs2) + 1/(Rt+R3+Rs3)) \quad \text{Equation 9}$$

As a result, the output impedance of the output buffer circuit according to Example 1 becomes a constant value, regardless of the output voltage of the transmission signal, the preemphasis amount, and the number of preemphasis taps. By making the foregoing output impedance match the characteristic impedance of the transmission line, the recurrent reflection at the output terminal of the output buffer circuit can be prevented; therefore, an output buffer circuit suitable for high-speed operation can be obtained.

Each of the circuits for Selector 1 to Selector 3 and the corresponding previous-stage inverter can be configured with two stages of two-input NANDs; the increase in jitter, which is caused by increase in effects of power-source noise, due to increase in the delay time because of the selector circuit, is within a tolerance range.

In addition, the inverted signal that, as is the case with the data signal, is generated by a circuit unillustrated in FIG. 1 may be generated in the output buffer circuit. Additionally, the respective output resistors Rs1 to Rs3 that are included in Buffer 1 to Buffer 3 may preferably be formed of a resistance element so as to prevent the increase in the rising time of a transmission-signal waveform; however, the respective output resistors may be integrated with the transistors 11 to 16. Additionally, in Example 1, the reception terminal of the transmission line is terminated with Rt connected to the termination voltage Vt; however, the Thevenin-type termination, in which the reception terminal is connected to Vdd and Vss, may be employed. Additionally, in Example 1, a single-end output buffer circuit is described; however, two systems of circuits that are each identical to the output buffer circuit may be provided so as to configure a differential output buffer circuit.

Alternatively, when being required, a further variation in setting the preemphasis amount can be realized by adding the same buffer circuits as Buffer 1 to Buffer 3, as far as the output impedance of the output buffer circuit matches the characteristic impedance of the transmission line. It is obvious that, in the case where the addition of the preemphasis taps is further required, a configuration, in which delayed signals of delay amounts corresponding to the required number of taps are generated and the taps can be selected through the selectors, is readily realized.

Example 2

Figure 3:
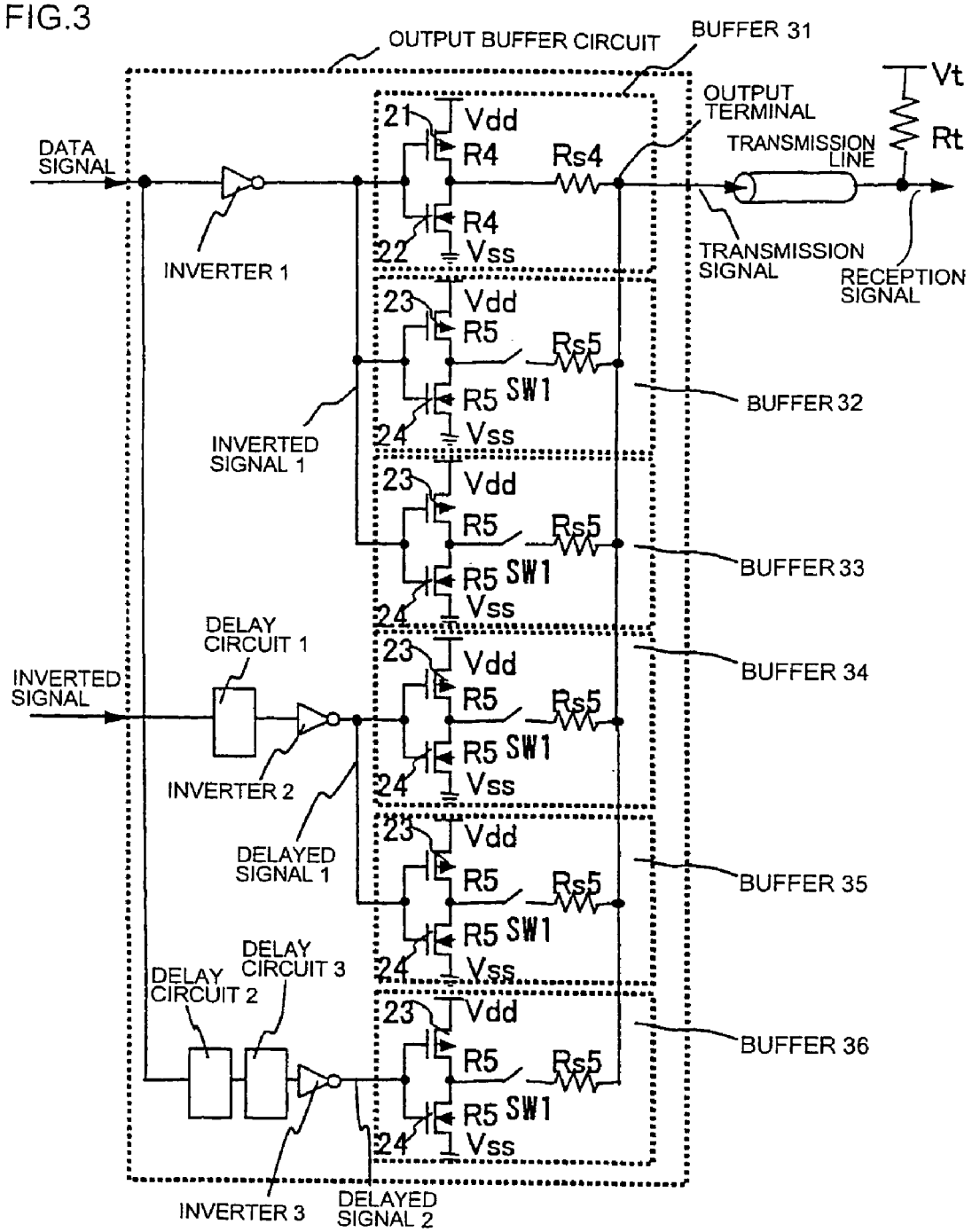
FIG. 3 is an explanatory diagram for a circuit configuration according to Example 2.

Example 2 will be explained. FIG. 3 is a configuration diagram illustrating circuitry according to Example 2 of the present invention. The output buffer according to Example 2 includes buffers 31 to 36 that are connected in parallel with one another, Inverter 1 to Inverter 3, and Delay Circuit 1 to Delay Circuit 3. The output buffer receives a data signal and the inverted signal of the data signal and outputs a transmission signal to a transmission line connected to the output terminal. The transmission line is connected at a reception terminal to a termination voltage Vt via a termination resistor Rt; the termination resistor Rt is made equal to the characteristic impedance of the transmission line so that no reflection wave is caused due to an impedance mismatch.

In Example 2, the objective, in which the output impedance of an output buffer circuit having an preemphasis function is made constant regardless of an adjustable preemphasis amount, the number of preemphasis taps, and an operation time instant, is achieved by limiting the number of buffers, among buffers redundantly provided, that concurrently turn ON, thereby making the output impedance of the output buffer circuit equal to the characteristic impedance of the transmission line.

Inverter 1 receives a data signal having a logic value to be transmitted to the output terminal and outputs Inverted Signal 1. Inverted Signal 1 is inputted to the buffers 31, 32, and 33. Delay Circuit 1 receives an inverted signal having a logic value obtained by inverting a logic value to be transmitted to the output terminal and outputs Delayed Signal 1 via Inverter 2. Delayed Signal 1 is inputted to the buffers 34 and 35. Delay Circuit 2 receives a data signal and outputs Delayed Signal 2 via Delay Circuit 3 and Inverter 3. Delayed Signal 2 is inputted to the buffer 36. Delay Circuit 1 to Delay Circuit 3 each outputs a signal obtained by delaying an input signal by a specific time represented by a time corresponding to one cycle of a data signal.

The buffer 31 receives Inverted Signal 1 and outputs: at the output terminal a transmission signal. The buffer 31, in which a P-type transistor 21 and an N-type transistor 22 that are connected between a high-potential power source Vdd and a low-potential power source Vss operate complementarily to each other, drives the output terminal via an output resistor Rs4. The P-type transistor 21 and the N-type transistor 22 are each designed to have the same ON resistance R4; thus, the output impedance of the buffer 31 is given by the combined series resistance (R4+Rs4) of R4 and Rs4.

The buffers 32 and 33 each receive Inverted Signal 1; the buffers 34 and 35 each receive Delayed Signal 1; the buffer 36 receives Delayed Signal 2.

The buffers 32 to 36, in each of which a P-type transistor 23 and an N-type transistor 24 that are connected between the high-potential power source Vdd and the low-potential power source Vss operate complementarily to each other, each drive the output terminal via a switch SW1 and an output resistor Rs5. When the switch SW1 is OFF, the buffers 32 to 36 do not drive the output terminal. The P-type transistor 23 and the N-type transistor 24 are each designed to have the same ON resistance R5; thus, the output impedances of the buffers 32 to 36 are each given by the combined series resistance (R5+Rs5) of R5 and Rs5.

In Example 2, in the butter 31, either one of the P-type transistor and the N-type transistor turns ON. In addition, under the condition that the switches Sw1 of two buffers out of the five buffers 32 to 36 are turned to ON, the P-type transistors or the N-type transistors turn ON, and the switches SW1 of the three buffers are turned to OFF, the output impedance Rs of the output buffer circuit is given by Equation 10.

$$Rs=(R4+Rs4)\times((R5+Rs5)/2)((R4+Rs4)+(R5+Rs5)/2) \quad \text{Equation 10}$$

The switches SW1 of the buffers 32 to 36 are controlled through a level signal generated by an external circuit unillustrated in FIG. 3 and changing the switches SW1 to be turned to ON is possible, as long as only three out of the five buffers are turned to ON; thus, the preemphasis amount and the number of preemphasis taps can be selected. As far as the output impedance, represented by equation 10, of the output buffer circuit coincides with the characteristic impedance of the transmission line, the ON-resistance values of the buffers 31 and 32, i.e., (R4+Rs4) and (R5+Rs5), respectively, can be designed so as to change the preemphasis amount; therefore, an output buffer circuit that can cope with various transmission-loss conditions is obtained.

Figure 4:
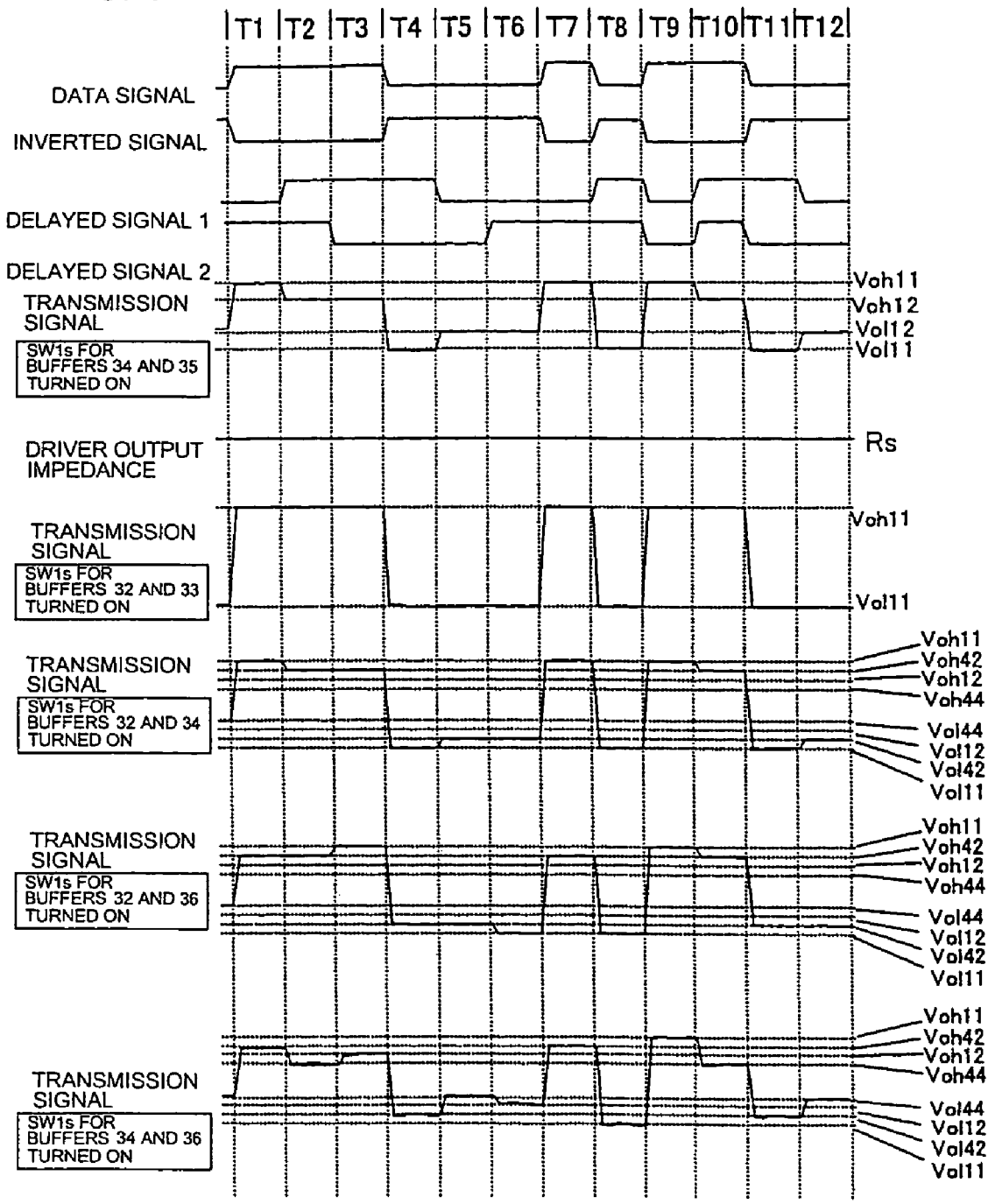
FIG. 4 is a timing chart representing the operation of Example 2.

FIG. 4 is a timing chart representing the operation of Example 2. In the case where the buffers 34 and 35 are turned to ON, as represented in FIG. 4, the transmission signal includes four output voltages, i.e., Voh11 given by Equation 11, Voh12 given by Equation 12, Vol11 given by Equation 13, and Vol12 given by equation 14; thus, an output waveform preemphasized by use of the data signal in the once previous cycle is obtained.

$$Voh11=Vt+Rt\times(Vdd-Vt)\times(1/(Rt+R4+Rs4)+2/(Rt+R5+Rs5)) \quad \text{Equation 11}$$

$$Voh12=Vt+Rt\times(Vdd-Vt)\times(1/(Rt+R4+Rs4)) \quad \text{Equation 12}$$

$$Vol11=Vt-Rt\times(Vt-Vss)\times(1/(Rt+R4+Rs4)+2/(Rt+R5+Rs5)) \quad \text{Equation 13}$$

$$Vol12=Vt-Rt\times(Vt-Vss)\times(1/(Rt+R4+Rs4)) \quad \text{Equation 14}$$

In the case where the buffers 32 and 33 are turned to ON, the transmission signal includes two output voltages, i.e., Voh11 given by Equation 11 and Vol11 given by Equation 13; thus, a non-preemphasized output waveform is obtained.

In the case where the buffers 32 and 34 are turned to ON, the transmission signal includes four output voltages, i.e., Voh42 given by Equation 15 and Vol42 given by Equation 17 in addition to Voh11 given by Equation 11 and Vol11 given by Equation 13; thus, an output waveform preemphasized by use of the data signal in the once previous cycle is obtained.

$$Voh42=Vt+Rt\times(Vdd-Vt)\times(2/(Rt+R4+Rs4)) \quad \text{Equation 15}$$

$$Voh44=Vt+Rt\times(Vdd-Vt)\times(1/(Rt+R4+Rs4))-Rt\times(Vt-Vss)\times(2/(Rt+R5+Rs5)) \quad \text{Equation 16}$$

$$Vol42=Vt-Rt\times(Vt-Vss)\times(2/(Rt+R4+Rs4)) \quad \text{Equation 17}$$

$$Vol44=Vt-Rt\times(Vt-Vss)\times(1/(RL+R4+Rs4))+Rt\times(Vdd-Vt)\times(2/(Rt+R5+Rs5)) \quad \text{Equation 18}$$

In the case where the buffers 32 and 36 are turned to ON, the transmission signal includes four output voltages, i.e., Voh42 given by Equation 15 and Vol42 given by Equation 17 in addition to Voh11 given by Equation 11 and Vol11 given by Equation 13; thus, an output waveform preemphasized by use of the data signal in the once and twice previous cycles is obtained.

In the case where the buffers 34 and 36 are turned to ON, the transmission signal includes eight output voltages, i.e., Voh42 given by Equation 15, Voh44 given by Equation 16, Vol42 given by Equation 17, Vol44 given by Equation 18, in addition to Voh11 given by Equation 11, Voh12 given by Equation 12, Vol11 given by Equation 13, Vol12 given by Equation 14; thus, an output waveform preemphasized by use of the data signal in the once and twice previous cycles is obtained, so that an output buffer circuit further suitable for high-speed operation is obtained. Also in this case, the output impedance Rs of the output buffer circuit is a constant value given by Equation 10.

As a result, the output impedance of the output buffer circuit according to Example 2 becomes a constant value, regardless of the output voltage of the transmission signal, the preemphasis amount, and the number of preemphasis taps. By making the foregoing output impedance match the characteristic impedance of the transmission line, the recurrent reflection at the output terminal of the output buffer circuit can be prevented; therefore, an output buffer circuit suitable for high-speed operation can be obtained.

In addition, the inverted signal that, as is the case with the data signal, is generated by a circuit unillustrated in FIG. 3 may be generated in the output buffer circuit. Additionally, the respective output resistors Rs4 to Rs5 that are included in the buffers 31 to 36 may preferably be formed of a resistance element so as to prevent the increase in the rising time of a transmission-signal waveform; however, the respective output resistors may be integrated with the transistors 21 to 23. Additionally, in Example 2, the reception terminal of the transmission line is terminated with Rt connected to the termination voltage Vt; however, a Thevenin-type termination, in which the reception terminal is connected to Vdd and Vss, may be employed. Additionally, in Example 2, a single-end output buffer circuit is described; however, two systems of circuits that are each identical to the output buffer circuit may be provided so as to configure a differential output buffer.

Additionally, a configuration, in which the respective characteristics of Example 1 and Example 2 are combined, i.e., the selector circuits utilized in Example 1 are provided before the buffers in Example 2 and the respective input signals for the buffers can be selected through selection signals, is also effective.

Example 3

Figure 5:
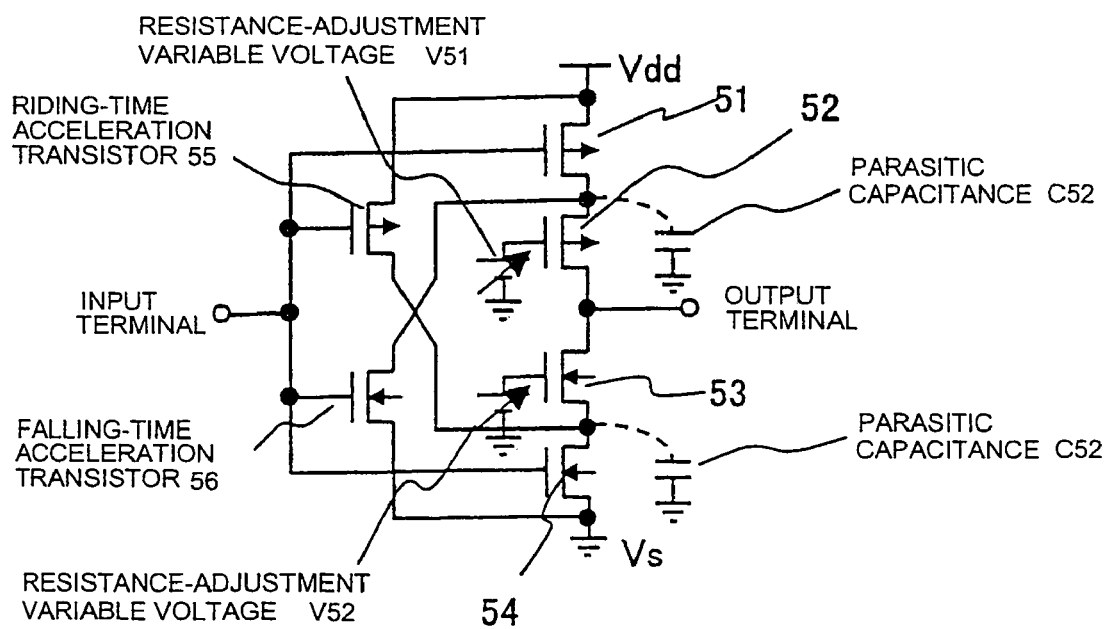
FIG. 5 is an explanatory diagram for the circuit configuration of a buffer according to Example 3.

Example 3 will be explained. FIG. 5 is a circuit diagram illustrating the circuit configuration of a buffer according to Example 3 of the present invention. The configuration according to Example 3 is in such a way that part or all of Buffer 1 to Buffer 3 of the output buffer circuit according to Example 1 described above, or part or all of the buffers 31 to 36 of the output buffer circuit according to Example 2, each include the circuit illustrated in FIG. 5; the ON resistance of the buffer is made variable and the resistance value is enabled to be controlled by a voltage supplied from the outside of the buffer, so that the output impedance can be adjusted further flexibly.

In each of the buffers according to Example 3, a P-type transistor 51 and an N-type transistor 54 are connected between a high-potential power source Vdd and a low-potential power source Vss, and with the assistance of a signal applied to the input terminal, operate complementarily to each other; a P-type transistor 52 and an N-type transistor 53, which function as variable resistors, are connected between the P-type transistor 51 and the N-type transistor 54. The P-type transistor 52 and the N-type transistor 53 are connected to the output terminal.

A resistance-adjustment variable voltage V51 is applied to the gate pin of the P-type transistor 52; by adjusting the voltage, the ON resistance of the P-type transistor 52 is adjusted. Additionally, a resistance-adjustment variable voltage V52 is applied to the gate pin of the N-type transistor 53; by adjusting the voltage, the ON resistance of the N-type transistor 53 is adjusted.

In the case where it is required to cope with the increase, in falling time, which is caused by a parasitic capacitance C52 produced by P-type transistor 52, a falling-time acceleration transistor 56 is connected. In the case where it is required to cope with the increase, in rising time, which is caused by a parasitic capacitance C53 produced by N-type transistor 53, a rising-time acceleration transistor 55 is connected. The rising-time acceleration transistor 55 and the falling-time acceleration transistor 56 operate complementarily to each other, with the assistance of a signal applied to the input terminal.

The resistance-adjustment variable voltages V51 and V52 are generated and controlled by means that are not illustrated in FIG. 5. Alternatively, the overall output impedance of the output buffer circuit can be varied, as far as it coincides with the characteristic impedance of the transmission line; therefore, the variation in the output impedance caused by unevenness in the LSI process or in the power-source voltage can be corrected, so that a necessary preemphasis amount can be adjusted and obtained.

Example 4

Figure 6:
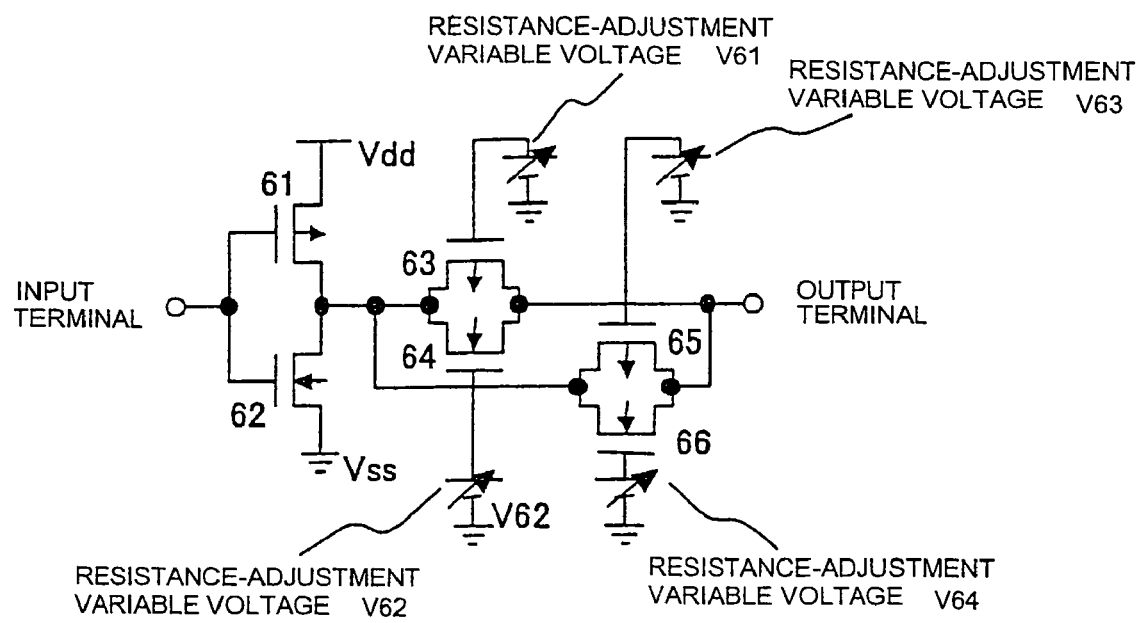
FIG. 6 is an explanatory diagram for the circuit configuration of a buffer according to Example 4.
Figure 7:
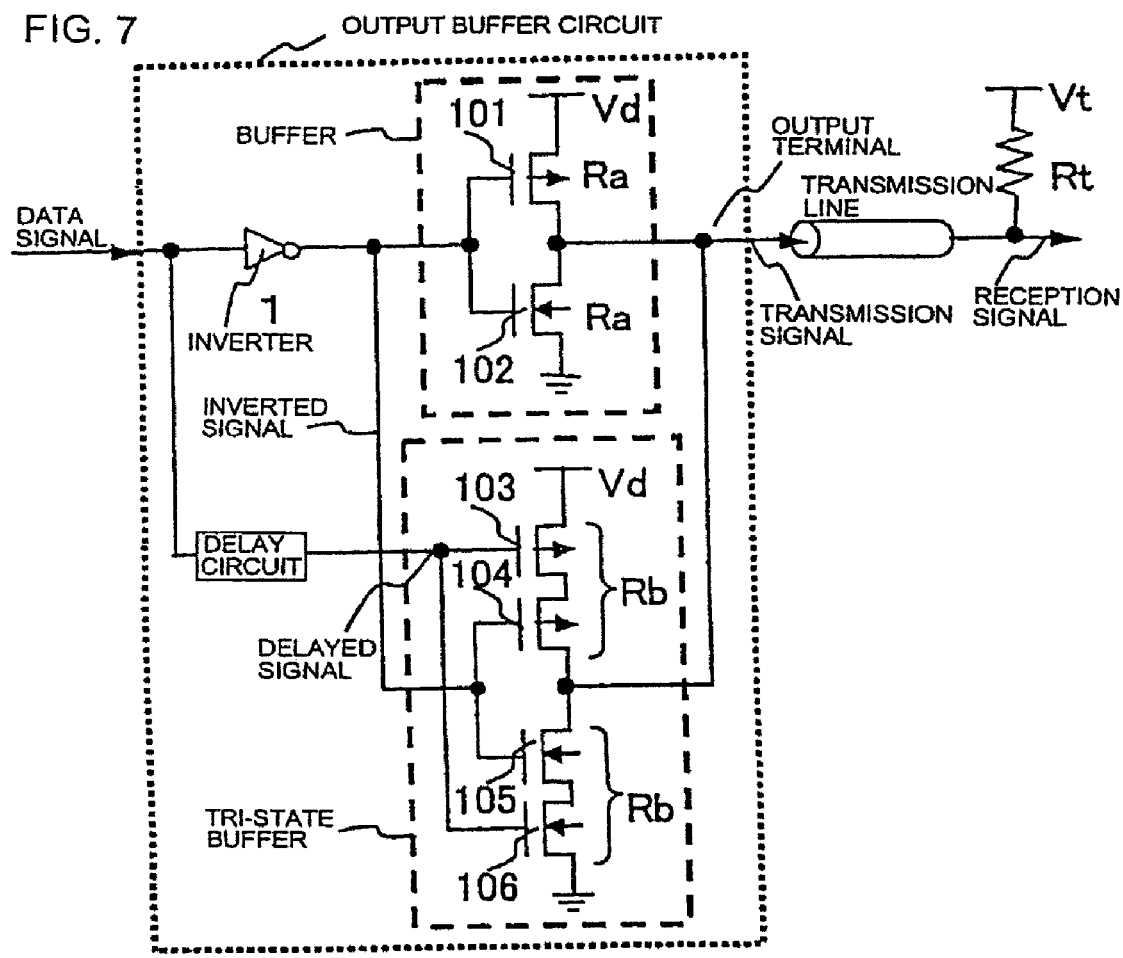
FIG. 7 is an explanatory diagram representing a conventional configuration example.
Figure 8:
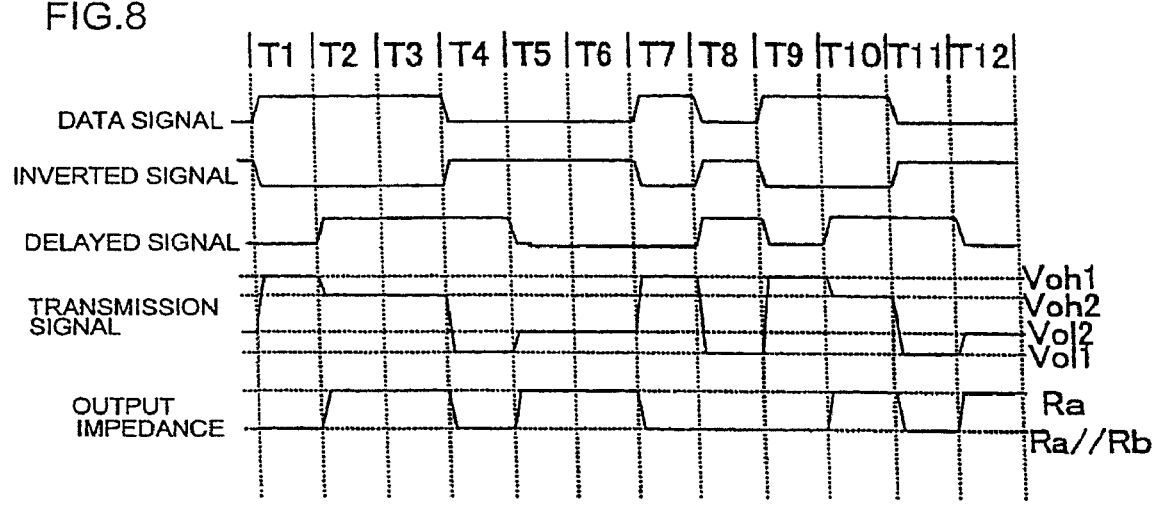
FIG. 8 is a time chart representing the operation of a conventional example.

Example 4 will be explained. FIG. 6 is a circuit diagram illustrating the circuit configuration of a buffer according to Example 4 of the present invention. The configuration according to Example 4 is in such a way that part or all of Buffer 1 to Buffer 3 of the output buffer circuit according to Example 1 described above, or part or all of the buffers 31 to 36 of the output buffer circuit according to Example 2, each include the circuit illustrated in FIG. 6; the ON resistance of the buffer is made variable and the resistance value is enabled to be controlled by a voltage supplied from the outside of the buffer, so that the output impedance can be adjusted further flexibly.

In each of the buffers according to Example 4, a P-type transistor 61 and an N-type transistor 62 are connected between a high-potential power source Vdd and a low-potential power source Vss, and with the assistance of a signal applied to the input terminal, operate complementarily to each other; a P-type transistor 63 and an N-type transistor 64, which function as variable resistors, and, as may be necessary, a P-type transistor 65 and an N-type transistor 66 are connected between the output for the P-type transistor 61 and the N-type transistor 62 and the output terminal of the buffer.

A resistance-adjustment variable voltage V61 is applied to the gate pin of the P-type transistor 63; by adjusting the voltage, the ON resistance of the P-type transistor 63 is adjusted. Additionally, a resistance-adjustment variable voltage V62 is applied to the gate pin of the N-type transistor 64; by adjusting the voltage, the ON resistance of the N-type transistor 64 is adjusted.

Moreover, if necessary, a resistance-adjustment variable voltage V63 is applied to the gate pin of the P-type transistor 65; by adjusting the voltage, the ON resistance of the P-type transistor 65 is adjusted. Additionally, a resistance-adjustment variable voltage V64 is applied to the gate pin of the N-type transistor 66; by adjusting the voltage, the ON resistance of the N-type transistor 66 is adjusted.

The resistance-adjustment variable voltages V61, V62, V63 and V64 are generated and controlled by means that are not illustrated in FIG. 6. The overall output impedance of the output buffer circuit can be varied as far as it coincides with the characteristic impedance of the transmission line, and the number of adjustment variable voltages is larger than that in Example 3; therefore, the variation in the output impedance caused by unevenness in the LSI process or in the power-source voltage can be corrected further finely, so that a necessary preemphasis amount can be adjusted and obtained.

As explained in the foregoing examples, output buffer circuits according to an embodiment of the present invention have the following configurations. The output buffer circuits each have a preemphasis function and transmit a logic signal to a transmission line; a first output buffer circuit includes two or more buffers that are connected in parallel with one another; in each of the buffers, a P-type transistor and an N-type transistor that are connected between the high-potential power source Vdd and the low-potential power source Vss operate complementarily to each other, with the assistance of an input signal, and the ON resistance is constant regardless of the output voltage. The first output buffer circuit receives a data signal and the inverted signal of the data signal; respective signals to be inputted to the buffers can be selected through selector logic before each of the buffers; the first output buffer circuit includes inverters for inverting the data signal and delay circuits for delaying the data signal for a specific time. The respective ON resistances of the buffers are determined in such a way that the output impedance of the output buffer circuit, i.e., a specific value determined by the combined parallel resistance value of the ON resistances of two or more buffers coincides with the characteristic impedance of a transmission line connected to the output terminal, and that the desired preemphasis amount and the number of preemphasis taps are satisfied. In addition, the preemphasis amount and the number of preemphasis taps are adjusted through select-logic selection signals; the transmission line is terminated at the reception terminal by the termination resistor connected to the termination voltage.

The output resistor included in each of the buffers of the first output buffer circuit is formed of a resistance element or a P-type transistor and an N-type transistor, which operate complementarily to each other, that are integrated in the buffer.

The termination form of the reception terminal of the transmission line for the first output buffer circuit is a Thevenin-type termination in which the reception terminal is connected to the high-potential power source Vdd and the low-potential power source Vss.

The first output buffer circuit is included in a differential output buffer in which two systems of circuits that are each identical to the first output buffer circuit are provided.

A second output buffer circuit includes buffers that are redundantly connected in parallel with one another; by limiting the number of buffers, among the buffers, that concurrently turn ON, the output impedance of the output buffer circuit, i.e., a specific value determined by the combined parallel resistance value of the respective ON resistances of the buffers that concurrently turn ON is determined in such a way as to coincide with the characteristic impedance of a transmission line connected to the output terminal and to satisfy the desired preemphasis amount and the number of preemphasis taps. In addition, the number of the buffers that concurrently turn ON is controlled by respective switches provided in series with the output resistors of the buffers; by selecting buffers the switches for which are to be turned ON, the preemphasis amount and the number of preemphasis taps are adjusted; the transmission line is terminated at the reception terminal by the termination resistor connected to the termination voltage.

The output resistor included in each of the buffers of the second output buffer circuit is formed of a resistance element or a P-type transistor and an N-type transistor, which operate complementarily to each other, that are integrated in the buffer.

The termination form of the reception terminal of the transmission line for the second output buffer circuit is a Thevenin-type termination in which the reception terminal is connected to the high-potential power source Vdd and the low-potential power source Vss.

The second output buffer circuit is included in a differential output buffer in which two systems of circuits that are each identical to the second output buffer circuit are provided.

In addition, the configuration is in such a way that the second output buffer circuit includes respective selector circuits before the buffers and the input signal for each buffer can be selected through a selection signal.

In a third output buffer circuit, the respective ON resistances of part or all of the buffers included in the first or the second output buffer circuit are made variable, so that each of the resistance values can be controlled through a voltage supplied from the outside of the buffer. In each of the buffers, a P-type transistor and an N-type transistor are connected between a high-potential power source Vdd and a low-potential power source Vss, and with the assistance of a signal applied to the input terminal, operate complementarily to each other; transistors, which function as variable resistors, are connected between the P-type transistor and the N-type transistor; a resistance-adjustment variable voltage is applied to the gate pin of the variable-resistor transistor; by adjusting the voltage, the ON resistance of the buffer is adjusted.

Additionally, in the case where it is required to cope with the increase, in rising time, which is caused by a parasitic capacitance produced by variable-resistor transistor, a rising-time acceleration transistor is provided.

In a fourth output buffer circuit, the respective ON resistances of part or all of the buffers included in the first or the second output buffer circuit are made variable, so that each of the resistance values can be controlled through a voltage supplied from the outside of the buffer. In each of the buffers, a P-type transistor and an N-type transistor are connected between a high-potential power source Vdd and a low-potential power source Vss, and with the assistance of a signal applied to the input terminal, operate complementarily to each other; transistors, which function as variable resistors, are connected between the output for the P-type transistor and the N-type transistor and the output terminal of the buffer; a resistance-adjustment variable voltage is applied to the gate pin of each of the transistors; by adjusting the voltage, the ON resistance of the buffer is adjusted.

The configurations of the foregoing output buffer circuits according to the present invention are set forth below from a different aspect.

An output buffer circuit according to the present invention transmits a logic signal to a transmission line and, in accordance with the amount of transmission-line attenuation in the logic signal, creates the logic signal as a signal waveform consisting of four or more kinds of signal voltage levels. The output buffer circuit includes two or more buffers that are connected in parallel with one another to the output terminal and a plurality of selectors that correspond to the respective buffers. Each of the plurality of selectors receives a data signal that serves as a logic value of the logic signal and the inverted signal of the data signal, selects one of the data signal and the inverted signal of the data signal, and then inputs, as selector logic, the selected signal to one of the buffers, which corresponds to the selector. Each of the buffers has a P-type transistor and an N-type transistor that operate complementarily to each other, with the assistance of the selector logic that the buffer has received from one of the selectors, which corresponds to the buffer. The P-type transistor and the N-type transistor are connected in series between two power-source potentials; in accordance with the selector logic applied to each of the gates (the respective input terminals of the buffers), the voltage signal determined by the turn-on resistance of one of the P-type transistor and the N-type transistor and one of the power-source potentials, which is connected to the one of the P-type transistor and the N-type transistor is outputted from the connection point between the P-type transistor and the N-type transistor to the output terminal of the output buffer circuit. The plurality of selectors is controlled so as to create the selector logic with which each of the selectors adjusts the voltage signal that, in one of the buffers, corresponding to the selector, is outputted from the one of the P-type transistor and the N-type transistor, which is turned ON, to the output terminal of the output buffer circuit, by way of the connection point, so as to create a signal waveform to be included in the logic signal, and with which the combined resistance value of the respective resistances of the buffers coincides with the characteristic impedance of the transmission line connected to the output terminal of the output buffer circuit.

Two or more of the output buffer circuits may be connected in parallel with one another with respect to a second selector provided after the output terminals of the output buffer circuits so that one of the outputs from the two or more output buffer circuits is selected through the second selector (a first application example). Moreover, the two or more output buffer circuits may be connected, after the respective output terminals thereof, in parallel with one another, and the outputs from the two or more output buffer circuits may be selected through the respective switches provided at the output terminals of the two or more output buffer circuits so that, for example, the outputs from the output terminals to the transmission line is adjusted (a second application example). Furthermore, the two or more output buffer circuits at the output terminals of which respective switches are provided may be connected, after the switches, in parallel with one another with respect to a second selector so that the outputs from the two or more output buffer circuits are selected through the switches and the second selector (a third application example).

The resistors (e.g., provided for each of the two or more buffers) at the output terminals of the output buffer circuits may be made variable so that the voltage output from each of the output buffer circuits is controlled. Moreover, a pair of the buffers may be synchronized with each other and the respective outputs may be inputted to a buffer circuit such as a differential amplifier so that the output signal of the output buffer circuit is inverted. Furthermore, the one terminal of a transmission line the other terminal of which is connected to the output terminal of the output buffer circuit may be terminated in a Thevenin-type termination manner, as described above.

The effects of the present embodiment will be explained. In an output buffer circuit configured as described above, the ON resistance values of buffers are designed, the combination of the ON resistance values of buffers is selected through selector logic, the number of buffers connected in parallel with one another is controlled through switches, or the variable resistors are controlled and adjusted through voltage sources so that the combined parallel resistance value of the ON resistances of the buffers, i.e., the output impedance of the output buffer circuit is made constant, regardless of an adjustable preemphasis amount, the number of preemphasis taps, and an operation time instant, and matches the characteristic impedance of a transmission line; thus, recurrent reflection at the output terminal of the output buffer circuit can be prevented.

Provided the recurrent reflection cannot be prevented, recurrently reflected waves which are noise signals with different phases from that of the transmission signals are superimposed on a reception waveform, whereby jitters in the reception-signal waveform increase; therefore, the transmission frequency and the transmission distance are limited. Accordingly, by preventing recurrent reflection at the transmission terminal of the output buffer circuit, an effect, in which an output buffer circuit suitable for high-speed operation is obtained, can be demonstrated.

As described above, the present invention can be utilized for the applications in which data transmission, utilizing a transmission line, such as data transmission inside an LSI included in an electronic circuit device, data transmission between LSIs on a printed wire board, data transmission by way of a backplane between printed wire boards or via connectors, data transmission by way of a cable between printed wire boards, or data transmission by way of a cable between devices, is performed.

According to the present invention, the output impedance of an output buffer circuit having an preemphasis function or a deemphasis function is made to be constant, regardless of an adjustable preemphasis amount, the number of preemphasis taps, and an operation time instant, and to match the characteristic impedance of a transmission line; thus, an output buffer circuit, in which no recurrent reflection is caused at the output terminal thereof and which enables high-speed operation, can be obtained.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An output buffer circuit comprising:
   one or more inverters;
   a delay circuit for delaying an input signal for a specific time;
   one or more buffers;
   a function for transmitting a logic signal to a transmission path and, in accordance with an amount of signal attenuation in the transmission path, creating at a transmission side a waveform including four or more kinds of signal voltages; and
   a means for making a preemphasis amount variable and an ON resistance of the buffer constant,
   wherein the buffer, which controls the ON resistance thereof as a variable resistor, includes a P-type transistor and an N-type transistor that are connected between a high-potential power source and a low-potential power source; the P-type transistor and the N-type transistor operate complementarily to each other, with the assistance of a signal applied to the input terminal thereof; transistors configured to serve as variable resistors are connected between the P-type transistor and the N-type transistor; and respective resistance-adjustment variable voltages are applied to gate pins of the transistors serving as the variable resistors, and by adjusting the variable voltages, the ON resistance of the buffer is adjusted.

2. The output buffer circuit according to claim 1, wherein a selector circuit is included before the buffer, the inverter is capable of selecting through selector logic a signal to be inputted to the buffer and inverts a data signal, and the preemphasis amount and the number of preemphasis taps are adjusted through a selection signal for the selector logic, so that the preemphasis amount is made variable and the ON resistance of the buffer is made constant.

3. The output buffer circuit according to claim 1, wherein a selector is included before the buffer; the buffer includes a P-type transistor and an N-type transistor that are connected between a high-potential power source and a low-potential power source and operate complementarily to each other, with the assistance of an input signal, the ON resistance of the buffer is constant regardless of the output voltage, and two or more of the buffers are connected in parallel with one another; the inverter receives any one of or both of a data signal representing the logic value of the output of the buffer and the inverted signal of the data signal, can select through selector logic a signal to be inputted to the buffer, and inverts the data signal; the respective ON resistances of the buffers are determined in such a way that the combined parallel resistance value of the ON resistances of two or more of the buffers coincides with the characteristic impedance of a transmission line connected to the output terminal of the output buffer circuit; the preemphasis amount and the number of preemphasis taps are adjusted through a selection signal for the selector logic; and the transmission line is terminated, at the reception terminal thereof, with a termination resistor connected to a termination voltage.

4. The output buffer circuit according to claim 1, further including both a selector circuit before the buffer and a switch for making the preemphasis amount variable and the ON resistance of the buffer constant.

5. The output buffer circuit according to claim 1, wherein an output resistor included in the buffer is formed of a resistance element or a P-type transistor and an N-type transistor, which operate complementarily to each other, that are integrated in the buffer.

6. The output buffer circuit according to claim 1, wherein the ON resistances of part or all of the buffers are made to be variable and enabled to be controlled through respective voltages supplied from the outsides of the buffers.

7. The output buffer circuit according to claim 1, wherein the buffer, which controls the ON resistance thereof as a variable resistor, is provided with a rising-time acceleration transistor so as to reduce an effect, on rising time, of a parasitic capacitance produced by the variable-resistor transistor.

8. The output buffer circuit according to claim 1, wherein, in the buffer, which forms an output buffer circuit and controls the ON resistance thereof as a variable resistor, a P-type transistor and an N-type transistor that are connected between a high-potential power source and a low-potential power source operate complementarily to each other, with the assistance of a signal applied to the input terminal thereof; transistors that serve as variable resistors are connected between the output for the P-type transistor and the N-type transistor and the output terminal of the buffer; and respective resistance-adjustment variable voltages are applied to the gate pins of the transistors, and by adjusting the variable voltages, the ON resistance of the buffer is adjusted.

9. A transmission method utilizing an output buffer circuit including one or more inverters, a delay circuit for delaying an input signal for a specific time, one or more buffers, a function for transmitting a logic signal to a transmission path and in accordance with an amount of signal attenuation in the transmission path, creating at a transmission side a waveform including four or more kinds of signal voltages, and a selector circuit situated before the buffer, wherein the buffer, which controls the ON resistance thereof as a variable resistor, includes a P-type transistor and an N-type transistor that are connected between a high-potential power source and a low-potential power source; the P-type transistor and the N-type transistor operate complementarily to each other, with the assistance of a signal applied to the input terminal thereof; transistors configured to serve as variable resistors are connected between the P-type transistor and the N-type transistor; and respective resistance-adjustment variable voltages are applied to gate pins of the transistors serving as the variable resistors, and by adjusting the variable voltages, the ON resistance of the buffer is adjusted, the transmission method comprising the steps of:

inverting a data signal, the inverter being capable of selecting through selector logic a signal to be in putted to the buffer and inverts; and adjusting a preemphasis amount and the number of preemphasis taps through a selection signal for the selector logic, thereby making the preemphasis amount variable and the ON resistance of the buffer constant.

* * * * *